(12) United States Patent
Hwang

(10) Patent No.: US 12,581,729 B2
(45) Date of Patent: Mar. 17, 2026

(54) SEMICONDUCTOR DEVICE INCLUDING FIN FIELD EFFECT TRANSISTOR AND PLANAR FIN FIELD EFFECT TRANSISTOR

(71) Applicant: SAMSUNG ELECTRONICS CO., LTD., Suwon-si (KR)

(72) Inventor: Sungwoon Hwang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 462 days.

(21) Appl. No.: 17/965,025

(22) Filed: Oct. 13, 2022

(65) Prior Publication Data

US 2023/0299083 A1 Sep. 21, 2023

(30) Foreign Application Priority Data

Mar. 16, 2022 (KR) ........................ 10-2022-0032944

(51) Int. Cl.
| | |
|---|---|
| *H10D 84/83* | (2025.01) |
| *H10D 64/27* | (2025.01) |
| *H10D 84/01* | (2025.01) |
| *H10D 84/03* | (2025.01) |

(52) U.S. Cl.
CPC ......... *H10D 84/834* (2025.01); *H10D 64/514* (2025.01); *H10D 84/0144* (2025.01); *H10D 84/0158* (2025.01); *H10D 84/038* (2025.01)

(58) Field of Classification Search
CPC ........... H10D 84/0144; H10D 84/0158; H10D 84/0107
See application file for complete search history.

(56) References Cited

U.S. PATENT DOCUMENTS

| | | |
|---|---|---|
| 5,583,064 A | 12/1996 | Lee et al. |
| 6,734,113 B1 | 5/2004 | Cho et al. |
| 7,157,339 B2 | 1/2007 | Lim et al. |
| 9,224,826 B2 | 12/2015 | Kwon et al. |
| 9,716,139 B2 | 7/2017 | Chen et al. |
| 10,325,919 B1 | 6/2019 | Teng et al. |

(Continued)

FOREIGN PATENT DOCUMENTS

| | | | | |
|---|---|---|---|---|
| JP | 2000082813 A | * | 3/2000 | ....... H01L 29/66545 |
| KR | 10-0515383 B1 | | 9/2005 | |

OTHER PUBLICATIONS

Machine Translation of JP 2000082813 A (Year: 2000).*

*Primary Examiner* — Jacob Y Choi
*Assistant Examiner* — Aaron Michael Wegner
(74) *Attorney, Agent, or Firm* — Muir Patent Law, PLLC

(57) ABSTRACT

A semiconductor device includes a substrate, at least one finFET on a first area of the substrate, the at least one finFET including a first gate structure and first source/drain regions on opposite sides of the first gate structure, and a planar FET on a second area of the substrate, the planar FET including a second gate structure and second source/drain regions on opposite sides of the second gate structure, wherein the first gate structure includes a first gate insulating layer, a first metal gate, and first spacers, the second gate structure includes a second gate insulating layer, a second metal gate, and second spacers, wherein the upper surfaces of the fin and the substrate are at a same height, and wherein the second gate insulating layer includes a first oxide layer in a recess of the substrate and a second oxide layer on the first oxide layer.

14 Claims, 20 Drawing Sheets

100

(56) References Cited

U.S. PATENT DOCUMENTS

| | | | |
|---|---|---|---|
| 10,431,664 | B2 | 10/2019 | Cheng et al. |
| 10,741,569 | B2 | 8/2020 | Liu et al. |
| 11,158,644 | B2 | 10/2021 | Wu et al. |
| 2003/0100155 | A1* | 5/2003 | Lim ................ H01L 21/823462 |
| | | | 257/E21.628 |
| 2009/0039444 | A1 | 2/2009 | Suzuki |
| 2016/0358919 | A1* | 12/2016 | Chen ................. H01L 29/66545 |
| 2020/0043939 | A1* | 2/2020 | Wu ................. H01L 21/823462 |
| 2020/0381442 | A1 | 12/2020 | Wu et al. |
| 2021/0343596 | A1 | 11/2021 | Yang et al. |
| 2022/0037465 | A1* | 2/2022 | Lin ...................... H10D 84/038 |
| 2022/0285344 | A1* | 9/2022 | Chuang ........... H01L 21/823412 |

* cited by examiner

SEMICONDUCTOR DEVICE INCLUDING FIN FIELD EFFECT TRANSISTOR AND PLANAR FIN FIELD EFFECT TRANSISTOR

CROSS-REFERENCE TO RELATED APPLICATION

This application is based on and claims priority under 35 U.S.C. § 119 to Korean Patent Application No. 10-2022-0032944, filed on Mar. 16, 2022, in the Korean Intellectual Property Office, the disclosure of which is incorporated by reference herein in its entirety.

BACKGROUND

1. Field

Embodiments relate to a semiconductor device, and more particularly, to a semiconductor device having a gate structure of a different structure.

2. Description of the Related Art

Due to various characteristics, e.g., miniaturization, multifunctionality, and/or low manufacturing cost, semiconductor devices are in the spotlight as an important factor in the electronic industry. Semiconductor devices may be classified into semiconductor memory devices storing logic data, semiconductor logic devices processing logic data, and hybrid semiconductor devices including semiconductor memory devices and semiconductor logic devices. With the highly developed electronic industry, the demand for semiconductor devices is increasing. For example, there is an increasing demand for high reliability, high speed, and/or multifunctionality of semiconductor devices. In order to satisfy the demand for these characteristics, structures inside semiconductor devices have increasing complexity and integration.

SUMMARY

According to an aspect of embodiments, there is provided a semiconductor device including a substrate defining a first area in which a fin extending in a first direction is formed and a second area in which no fin is formed; at least one finFETs including a first gate structure extending in a second direction perpendicular to the first direction while covering a part of the fin, and first source and drain regions on both side surfaces of the first gate structure in the first direction, on the substrate in the first area; and a planar FET including a second gate structure extending in the second direction, and second source and drain regions on both side surfaces of the second gate structure in the first direction, on the substrate in the second area, wherein the first gate structure includes a first gate insulating layer on the fin, a first metal gate on the first gate insulating layer, and first spacers on both sidewalls of the first metal gate, wherein the second gate structure includes a second gate insulating layer on the substrate, a second metal gate on the second gate insulating layer, and second spacers on both sidewalls of the second metal gate, wherein an upper surface of the fin in the first area and an upper surface of the substrate in the second area have substantially a same height, wherein the first gate insulating layer is formed on the upper surface of the fin, and wherein the second gate insulating layer includes a first oxide layer of a structure recessed downward from the upper surface of the substrate and a second oxide layer on the first oxide layer.

According to another aspect of embodiments, there is provided a semiconductor device including at least one finFETs on a first area of a substrate where a fin is formed; and a planar FET on a second area of the substrate where no fin is formed, wherein the at least one finFETs include a first gate structure covering a part of the fin, and first source and drain regions on both side surfaces of the first gate structure, wherein the planar FET includes a second gate structure on the substrate, and second source and drain regions on both side surfaces of the second gate structure, wherein the first gate structure includes a first gate insulating layer on the fin, wherein the second gate structure includes a second gate insulating layer on the substrate, wherein an upper surface of the fin in the first area and an upper surface of the substrate in the second area have substantially a same height, wherein the first gate insulating layer is formed on the upper surface of the fin, and wherein the second gate insulating layer has a structure recessed downward from the upper surface of the substrate.

According to yet another aspect of embodiments, there is provided a semiconductor device including a substrate defining a first area in which a fin extending in a first direction is formed and a second area in which no fin is formed; a first finFET including a first fin gate structure extending in a second direction perpendicular to the first direction while covering a part of the fin, on the substrate in the first area; a second finFET separated from the first finFET through a device isolation region and including a second fin gate structure extending in the second direction while covering a part of the fin, on the substrate in the first area; and a planar FET including a planar gate structure on the substrate in the second area, wherein an upper surface of the fin in the first area and an upper surface of the substrate in the second area have substantially a same height, wherein thicknesses increase in an order of a gate insulating layer of the first fin gate structure, a gate insulating layer of the second fin gate structure, and a gate insulating layer of the planar gate structure, and wherein the gate insulating layer of the planar gate structure has a structure recessed downward from the upper surface of the substrate.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
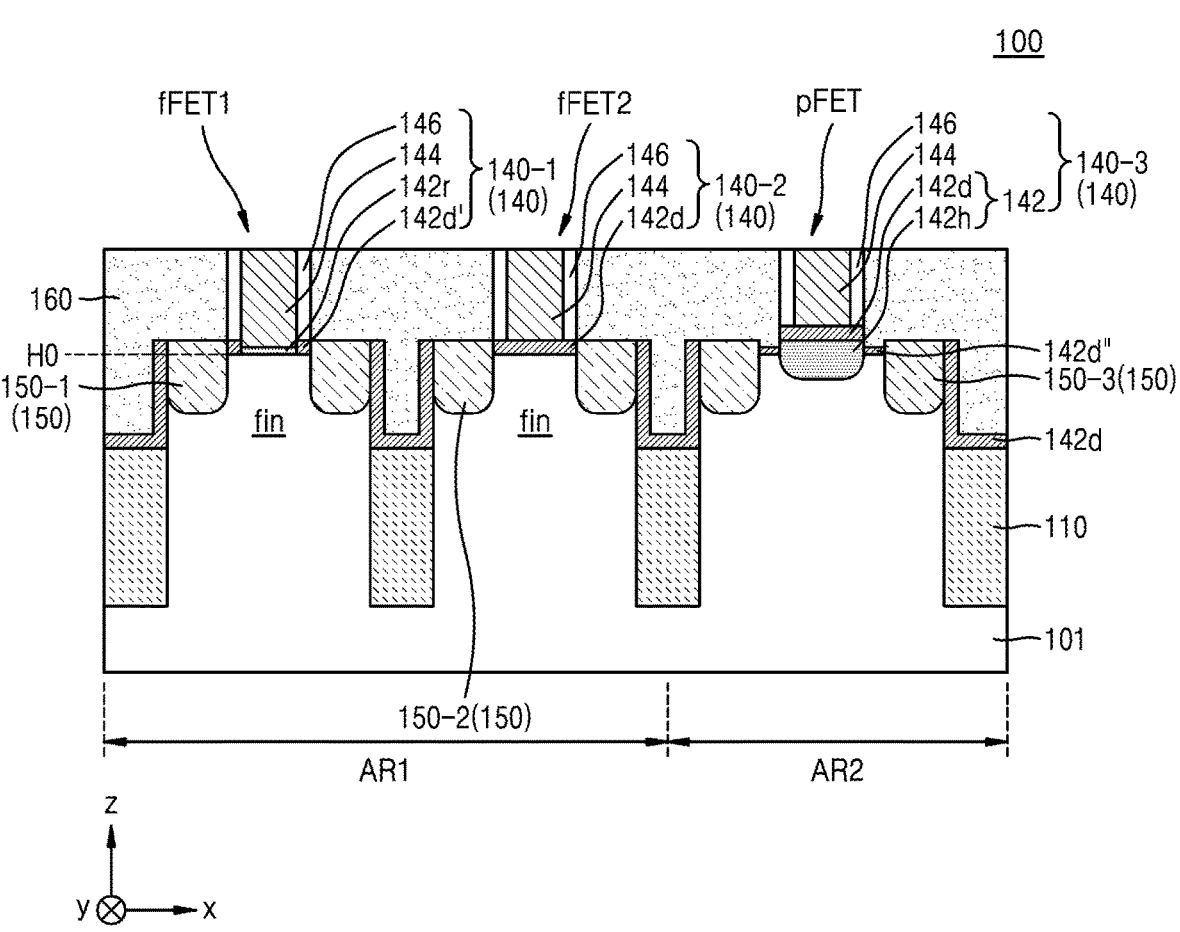
FIG. 1 is a cross-sectional view of a semiconductor device including fin field effect transistors (finFETs) and a planar field effect transistor (FET) according to an embodiment.

Hereinafter, embodiments will be described in detail with reference to the accompanying drawings. The same reference numerals are used for the same components in the drawings, and redundant descriptions thereof are omitted.

FIG. 1 is a cross-sectional view of a semiconductor device 100 including fin field effect transistors (finFETs) and a planar field effect transistor (FET) according to an embodiment.

Referring to FIG. 1, the semiconductor device 100 including the finFETs and the planar FET according to the present embodiment (hereinafter, simply referred to as a 'semiconductor device') may include a first finFET fFET1, a second finFET fFET2, and a planer FET pFET on a substrate 101. For example, the semiconductor device 100 of the present embodiment may include the first finFET fFET1 and the second finFET fFET2 on a first area AR1 of the substrate 101, and the planer FET pFET on a second area AR2.

More specifically, the semiconductor device 100 may include the substrate 101, a device isolation layer 110, and a gate structure 140. For example, the substrate 101 may include silicon (Si), e.g., single crystal silicon, polycrystalline silicon, or amorphous silicon. In another example, the substrate 101 may include a group IV semiconductor, e.g., germanium (Ge), a group IV-IV compound semiconductor, e.g., silicon germanium (SiGe) and silicon carbide (SiC), or a group III-V compound semiconductor, e.g., gallium arsenide (GaAs), indium arsenide (InAs), and indium phosphide (InP).

For example, the substrate 101 may be based on a silicon bulk substrate, or may be based on a silicon on insulator (SOI) substrate. In another example, the substrate 101 may be a substrate based on an epitaxial wafer, a polished wafer, an annealed wafer, etc. For example, the substrate 101 may include a conductive region, e.g., a well doped with impurities, or various structures doped with impurities. In addition, the substrate 101 may constitute a P-type substrate or an N-type substrate according to the type of doped impurity ions.

The substrate 101 may be divided into the first area AR1, i.e., an area in which fins are disposed, and the second area AR2, i.e., an area in which fins are not disposed. As described above, the first finFET fFET1 and the second finFET fFET2 may be disposed in the first area AR1, and the planar FET pFET may be disposed in the second area AR2. For example, the first finFET fFET1 and the second finFET fFET2 of the first area AR1 may be used as logic devices or arithmetic devices having various operating voltages, and the planar FET pFET of the second area AR2 may be used for devices having a high operating voltage. For example, the planar FET pFET of the second area AR2 may be used for input/output (I/O) devices or interface related devices.

The device isolation layer 110 may be disposed in a structure buried inside the substrate 101, and may include an insulating material. For example, the device isolation layer 110 may include an oxide layer, a nitride layer, and/or an oxynitride layer. The device isolation layer 110 may be disposed between fins and between the first area AR1 and the second area AR2. The device isolation layer 110 may separate the fins from each other and may also electrically separate the first area AR1 and the second area AR2 from each other.

Figure 4:
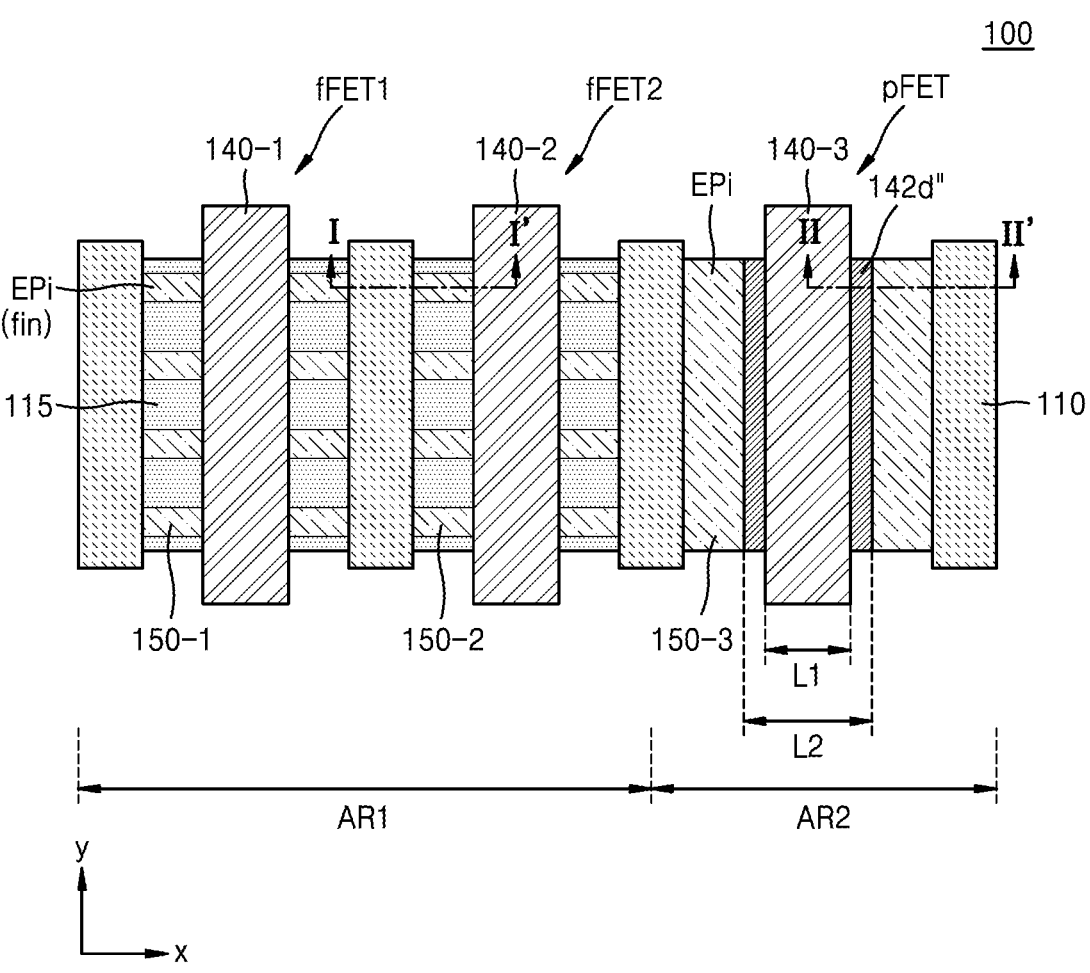
FIG. 4 is a plan view of the semiconductor device of FIG. 1.

A plurality of fins may be formed on an upper portion of the substrate 101 in the first area AR1, e.g., the fins may protrude upwardly from the substrate 101 in a vertical direction (e.g., in the z-direction). For example, as shown in FIG. 4, each of the fins (hatched horizontal lines) may extend in a first direction (e.g., in the x-direction) and may be spaced apart from each other in a second direction (e.g., in the y-direction). For example, as further shown in FIG. 4, the fins may be separated from each other in the second direction an inter-fin insulating layer 115. As illustrated in FIG. 1, the fins may have a structure extending from the substrate 101 to protrude from, e.g., above, upper surfaces of the device isolation layer 110 and the inter-fin insulating layer 115 in a third direction (z-direction).

The first finFET fFET1 and the second finFET fFET2 of the first area AR1 may include gate structures 140-1 and 140-2 and source/drain regions 150-1 and 150-2. In detail, the first finFET fFET1 may include the first gate structure 140-1 and the first source/drain region 150-1, and the second finFET fFET2 may include the second gate structure 140-2 and the second source/drain region 150-2.

The first source/drain region 150-1 and the second source/drain region 150-2 may be regions doped at high concentration. The first source/drain region 150-1 and the second source/drain region 150-2 may be formed by doping the fins of both side surfaces of the first gate structure 140-1 and the second gate structure 140-2 at high concentration in the first direction (e.g., in the x-direction) or may be formed through epi growth after removing upper portions of the fins.

The first gate structure 140-1 may include a first gate insulating layer 142*r*, a metal gate 144, and a spacer 146. Also, the second gate structure 140-2 may include a second gate insulating layer 142*d*, the metal gate 144, and the spacer 146.

The first gate insulating layer 142*r* of the first gate structure 140-1 may include an interface layer and a high-k dielectric layer. The interface layer may be formed of, e.g., silicon oxide ($SiO_2$) or silicon oxynitride (SiON). This interface layer may constitute the first gate insulating layer 142*r* together with the high-k dielectric layer.

The high-k dielectric layer may be formed of a dielectric material having a high dielectric constant k. For example, the high-k dielectric layer may be formed of a hafnium (Hf)-based or a zirconium (Zr)-based material. For example, the high-k dielectric layer may include at least one of hafnium oxide ($HfO_2$), hafnium silicon oxide (HfSiO), hafnium silicon oxynitride (HfSiON), hafnium oxynitride (HfON), hafnium aluminum oxide (HfAlO), hafnium lanthanum oxide (HfLaO), zirconium oxide ($ZrO_2$), zirconium silicon oxide (ZrSiO), etc. In addition, the high-k dielectric layer is not limited to the hafnium (Hf)-based or the zirconium (Zr)-based material but may include other materials, e.g., lanthanum oxide ($La_2O_3$), lanthanum aluminum oxide ($LaAlO_3$), tantalum oxide ($Ta_2O_5$), titanium oxide ($TiO_2$), strontium titanium oxide ($SrTiO_3$), yttrium oxide ($Y_2O_3$), aluminum oxide ($Al_2O_3$), lead scandium tantalum oxide ($PbSc_{0.5}Ta_{0.5}O_3$), lead zinc niobate ($PbZnNbO_3$), etc.

The second gate insulating layer 142*d* of the second gate structure 140-2 may be formed through a decoupled plasma nitridation (DPN) process. In other words, the second gate insulating layer 142*d* may be formed as an oxide layer through a chemical vapor deposition (CVD) process, and then by performing the DPN process on the oxide layer. Accordingly, the second gate insulating layer 142*d* may be referred to as a DPN oxide layer. For example, the second gate insulating layer 142*d* may have a thickness of about 35 angstroms to about 70 angstroms.

For example, the second gate insulating layer 142*d* may be formed of a metal oxide, silicates thereof, or aluminates. The metal oxide may be, e.g., hafnium oxide ($HfO_2$), zirconium oxide ($ZrO_2$), titanium oxide ($TiO_2$), aluminum oxide ($Al_2O_3$), etc. In another example, the second gate insulating layer 142*d* may be formed of a metal nitride oxide, silicates thereof, or aluminates. The metal nitride oxide may be, e.g., aluminum oxynitride (AlON), zirconium oxynitride (ZrON), hafnium oxynitride (HfON), lanthanum oxynitride (LaON), yttrium oxynitride (YON), etc. The silicates or aluminates may be, e.g., ZrSiON, HfSiON, LaSiON, YSiON, ZrAlON, HfAlON, etc.

The metal gate 144 of the first gate structure 140-1 and the second gate structure 140-2 may be formed of an n-type metal or a p-type metal. The N-type metal refers to a metal constituting a gate electrode of NMOS, and the P-type metal refers to a metal constituting a gate electrode of PMOS.

For example, when the metal gate 144 is formed of the N-type metal, the metal gate 144 may include an aluminum (Al) compound containing Ti or Ta. For example, the metal gate 144 may include an Al compound, e.g., TiAlC, TiAlN, TiAlC—N, TiAl, TaAlC, TaAlN, TaAlC—N, TaAl, etc. For example, the metal gate 144 as the N-type metal may be formed as two or more multilayers instead of a single layer.

For example, when the metal gate 144 of the first gate structure 140-1 and the second gate structure 140-2 is formed of the P-type metal, the metal gate 144 may include at least one of Mo, Pd, Ru, Pt, TiN, WN, TaN, Ir, TaC, RuN, or MoN. For example, the metal gate 144 may be formed as two or more multilayers instead of a single layer.

The spacers 146 of the first gate structure 140-1 and the second gate structure 140-2 may be formed on both, e.g., opposite, side surfaces of the metal gate 144 in the first direction (e.g., in the x-direction). In addition, the spacer 146 may be surrounded by an interlayer insulating layer 160. The spacer 146 may be formed of an insulating material, e.g., a nitride layer or an oxynitride layer. For example, the spacer 146 may be formed of a silicon nitride layer or a silicon oxynitride layer. The spacer 146 may be formed as a single layer or as a multilayer.

As illustrated in FIG. 1, the interlayer insulating layer 160 may be formed on the semiconductor substrate 101 and the device isolation layer 110, and may be formed between the gate structures 140-1, 140-2, and 140-3. Accordingly, the interlayer insulating layer 160 may have a structure surrounding side surfaces of the spacer 146. The interlayer insulating layer 160 may include at least one of a silicon oxide layer, a silicon nitride layer, a silicon oxynitride layer, or a combination thereof, and may be formed of a material having an etch selectivity different from that of the spacer 146.

In the semiconductor device 100 of the present embodiment, the first gate structure 140-1 may further include a first partial oxide layer 142d' on lower portions of the spacers 146 on both sides of the first gate insulating layer 142r, e.g., the first partial oxide layer 142d' may be between a bottom of the spacer 146 and a top pf the fin in the z-direction. The first partial oxide layer 142d' may correspond to a part of the second gate insulating layer 142d or the DPN oxide layer that remains without being etched in a process in which the second gate insulating layer 142d or the DPN oxide layer is replaced with the first gate insulating layer 142r. The first partial oxide layer 142d' will be described in more detail below with reference to FIGS. 2A to 2N.

A well may be formed in an upper portion of the substrate 101 in the second area AR2. The planar FET pFET of the second area AR2 may include a third gate structure 140-3 and a third source/drain region 150-3. The third source/drain region 150-3 may be a region doped at high concentration. The third source/drain region 150-3 may be formed by doping the upper portion of the substrate 101 on both sides of the third gate structure 140-3 at high concentration in the first direction (e.g., in the x-direction), or may be formed through epi growth after removing the upper portion of the substrate 101.

The third gate structure 140-3 may include a third gate insulating layer 142, the metal gate 144, and the spacer 146. The third gate insulating layer 142 may include a first oxide layer 142h and a second oxide layer 142d.

The first oxide layer 142h may be formed in a recessed structure on the substrate 101. That is, a lower surface of the first oxide layer 142h may be lower than the upper surface of the substrate 101, e.g., a lowermost surface of the first oxide layer 142h may be below an uppermost surface of the substrate 101 along the z-direction relative to a bottom of the substrate 101. For example, as illustrated in FIG. 1, an upper surface of the first oxide layer 142h may be higher than the upper surface of the substrate 101, e.g., an uppermost surface of the first oxide layer 142h may be higher than the uppermost surface of the substrate 101 along the z-direction relative to the bottom of the substrate 101. Here, the upper surface of the substrate 101 may have a reference height HO. In another example, the upper surface of the first oxide layer 142h may have substantially the same height as the upper surface of the substrate 101. The first oxide layer 142h may be formed by etching the upper portion of the substrate 101 to form a trench, and filling the trench with an oxide layer through a high density plasma (HDP) chemical vapor deposition (CVD) process. The process of forming the first oxide layer 142h will be described in more detail below with reference to FIGS. 2A to 2N.

The second oxide layer 142d may be substantially the same as the second gate insulating layer 142d, except that the second oxide layer 142d is formed on the first oxide layer 142h instead of on the substrate 101. Accordingly, the second oxide layer 142d is a DPN oxide layer and may have a thickness of, e.g., about 35 angstroms to about 70 angstroms. The metal gate 144 and the spacer 146 of the third gate structure 140-3 are respectively the same as those of the first gate structure 140-1 and the second gate structure 140-2.

As further illustrated in FIG. 1, in the semiconductor device 100 of the present embodiment, the planar FET pFET may include a partial oxide layer 142d'' between the first oxide layer 142h and the third source/drain regions 150-3 on both sides of the first oxide layer 142h. The second partial oxide layer 142d'' may correspond to a part of the second oxide layer 142d or the DPN oxide layer that remains without being etched in a process in which the second oxide layer 142d or the DPN oxide layer is etched. In some embodiments, the second partial oxide layer 142d'' may be included as a part of the third gate structure 140-3. The second partial oxide layer 142d'' will be described in more detail below with reference to FIGS. 2A to 2N.

In the semiconductor device 100 according to the present embodiment, the fin structured first and second finFETs fFET1 and fFET2 may be disposed in the first area AR1, and the planar FET pFET of the planar structure may be disposed in the second area AR2. The first and second finFETs fFET1 and fFET2 of the first area AR1 may be implemented in logic devices having various low operating voltages because the gate structures 140-1 and 140-2 have relatively thin gate insulating layers 142r and 142d. For example, the first finFET fFET1 may have an operating voltage of about 0.8 V, and the second finFET fFET2 may have an operating voltage equal to or less than of 2.2 V. The planar FET pFET of the second area AR2 may be implemented in a high voltage device having a relatively high operating voltage because the gate structure 140-3 has a relatively thick gate insulating layer 142. For example, the planar FET pFET may have an operating voltage equal to or greater than 3.3 V.

For reference, logic devices of the finFETs fFET1 and fFET2 formed in the first area AR1 may be implemented in a low power chip, e.g., a graphic card chip or a mobile application processor. Such logic devices may also be devices that perform actual operations, e.g., a central processing unit (CPU), and process various operations and logic, and the effective current compared to the leakage current is an important factor to be considered in the performance of the logic devices. For example, the CPU may require a high effective current value even if the leakage current is large, and a chip used as a graphics card need to have a smaller leakage current than that of the CPU, but the effective current value may be important. In addition, a mobile application processor needs to maintain a low leakage current values because an amount of power consumption is important along with the effective current value.

On the other hand, the planar FET pFET formed in the second area AR2 may be implemented, e.g., as an input/output (I/O) device. I/O devices are devices that interface with devices having different types of functions, e.g., memory devices, and may function to receive an external voltage and transmit the external voltage to logic devices, and to receive inputs from the logic devices and output inputs to the outside. Since the signal is received from the outside as above, the operating voltage of the I/O device may not change unless the external voltage is changed. For example, when the operating voltage of the I/O device is lowered and a gate dielectric layer is thin, the desired output may not be output. Accordingly, unlike the logic device, in the I/O device, a dielectric layer of a gate may be maintained relatively thick in order to maintain a high operating voltage.

In the semiconductor device 100 according to the present embodiment, the first and second finFETs fFET1 and fFET2 formed in the first area AR1 and the planar FET pFET formed in the second area AR2 may be formed together through the same semiconductor process. In other words, in the semiconductor device 100 according to the present embodiment, the formation process of the planar FET pFET is compatible with the formation process of the finFET, and thus, the planar FET pFET in the second area AR2 may be formed together, e.g., simultaneously and by the same method, with the first and second finFETs fFET1 and fFET2 of the first area AR1. As a result, in the semiconductor device 100 according to the present embodiment, the planar FET pFET may be easily implemented through the finFET process, and the reliability of the planar FET pFET may be improved.

Figure 2A:
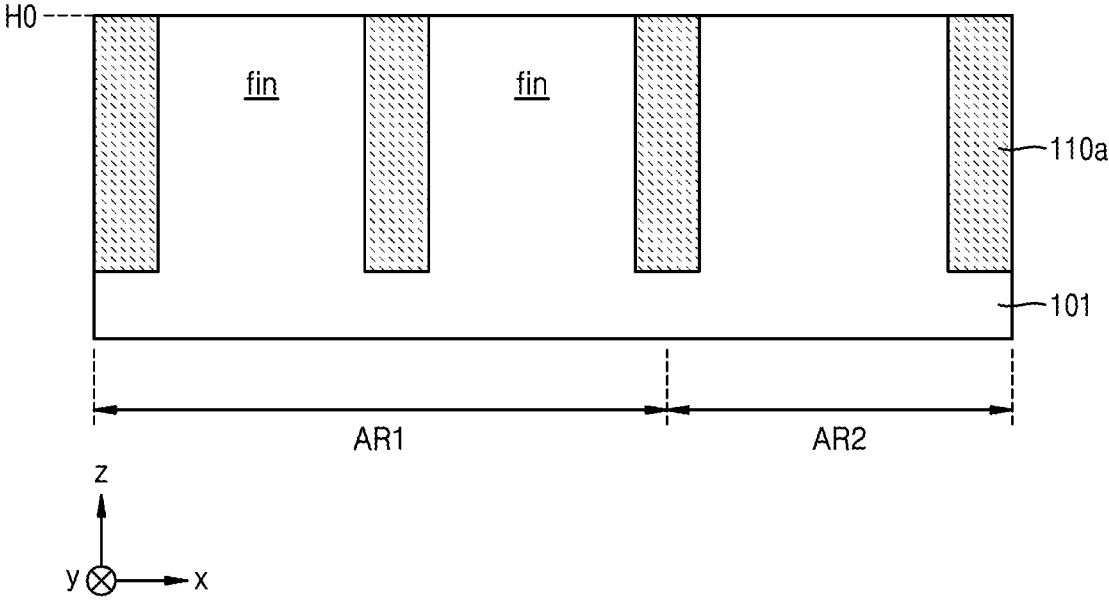
FIGS. 2A to 2N are cross-sectional views of stages in a method of manufacturing the semiconductor device of FIG. 1.
Figure 2B:
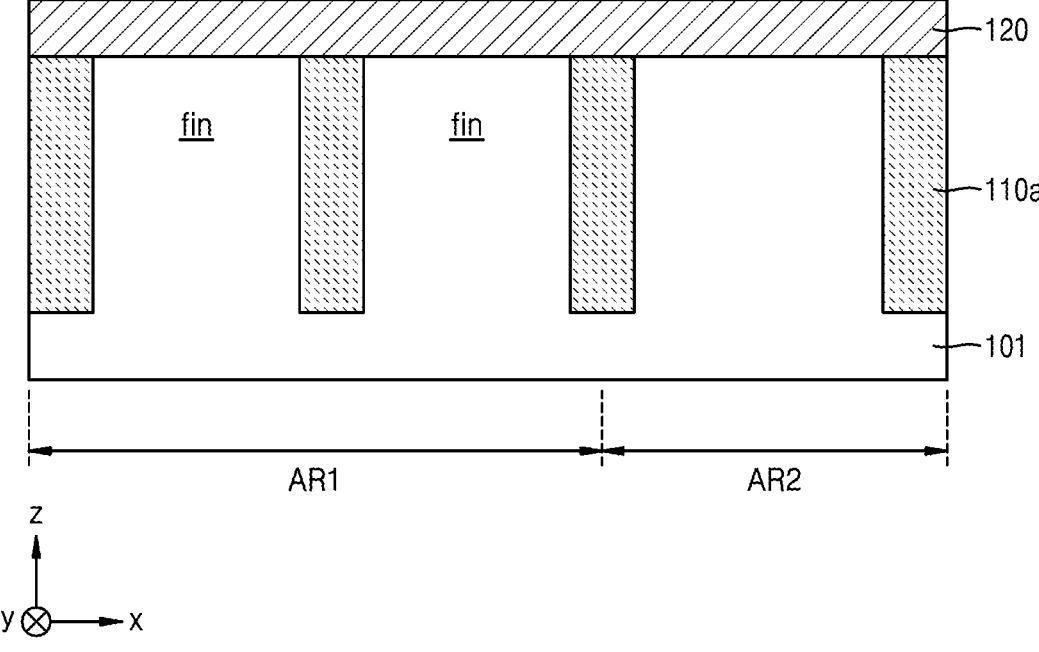
Figure 2C:
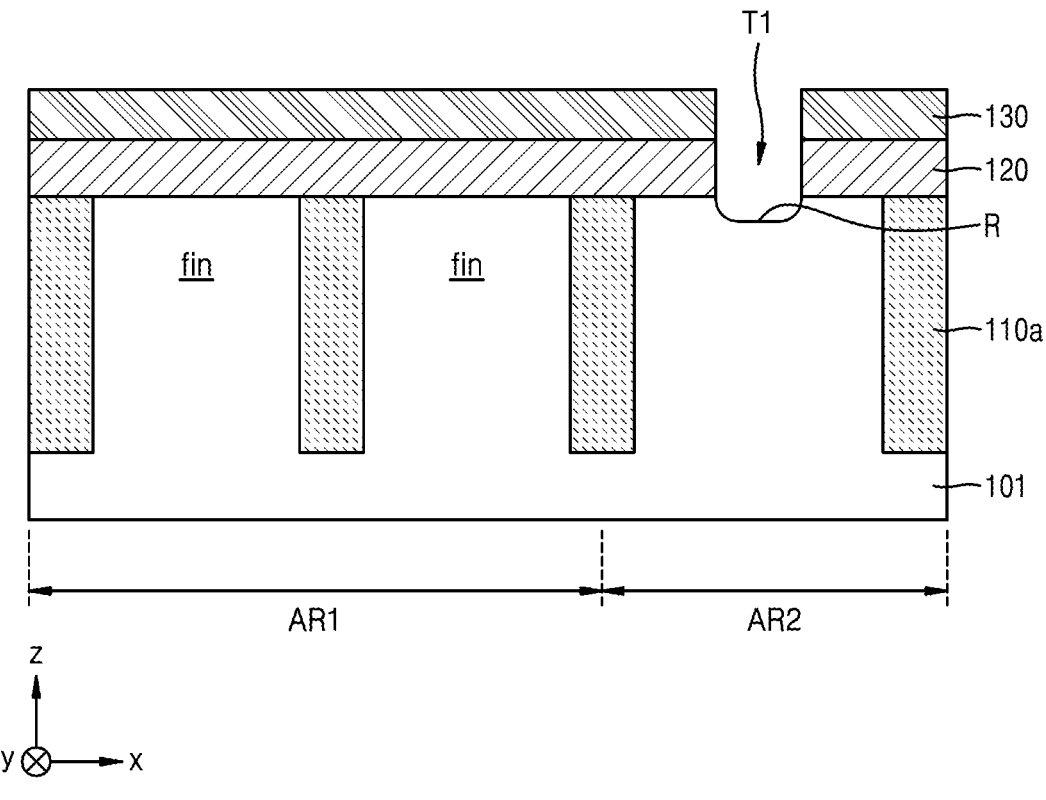
Figure 2D:
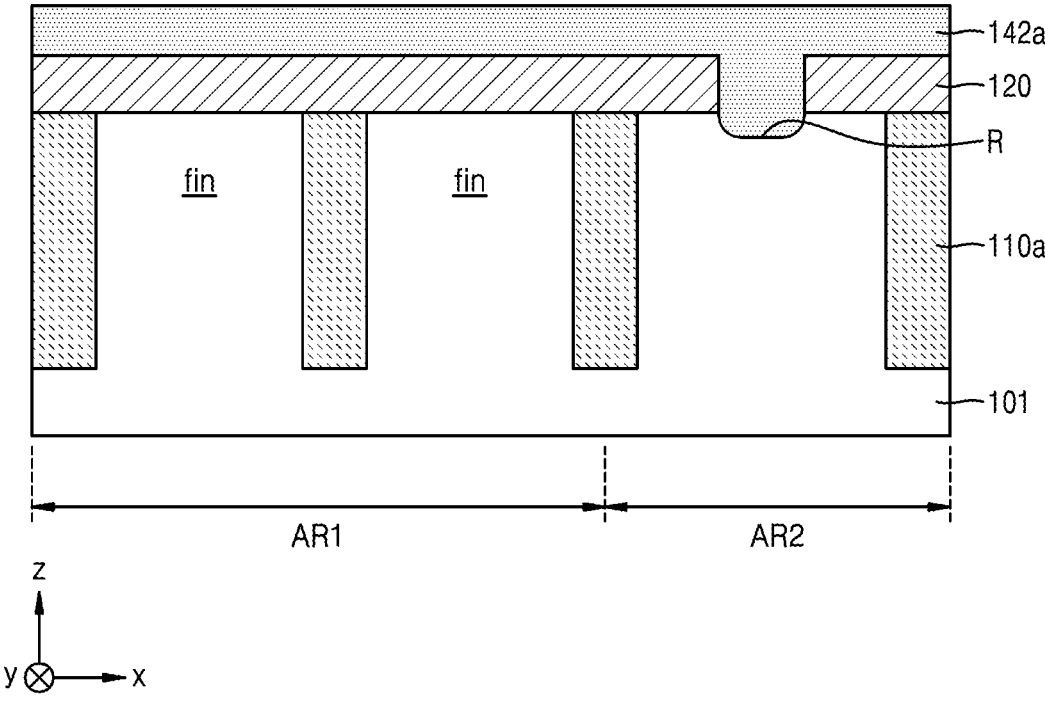
Figure 2E:
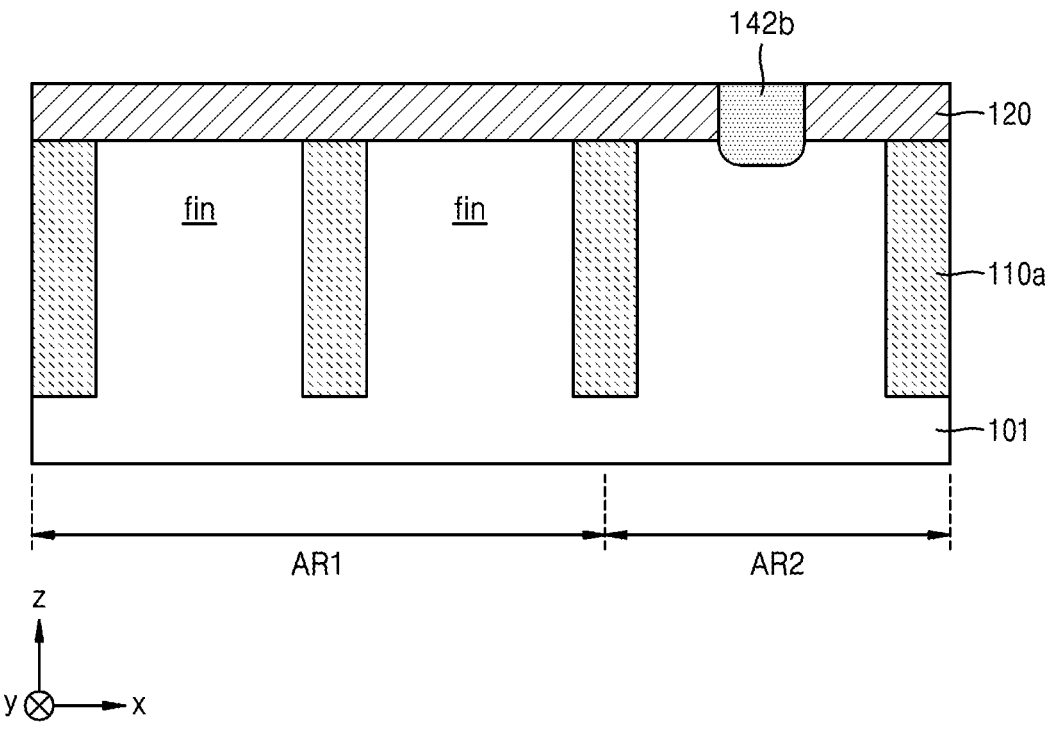
Figure 2F:
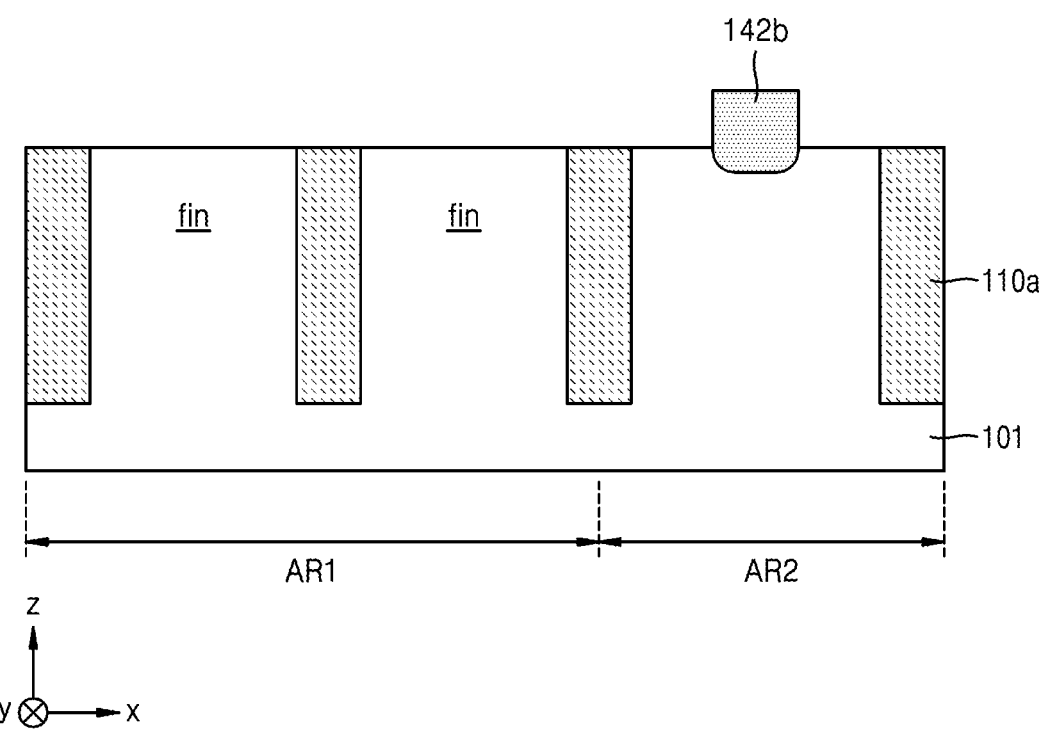
Figure 2G:
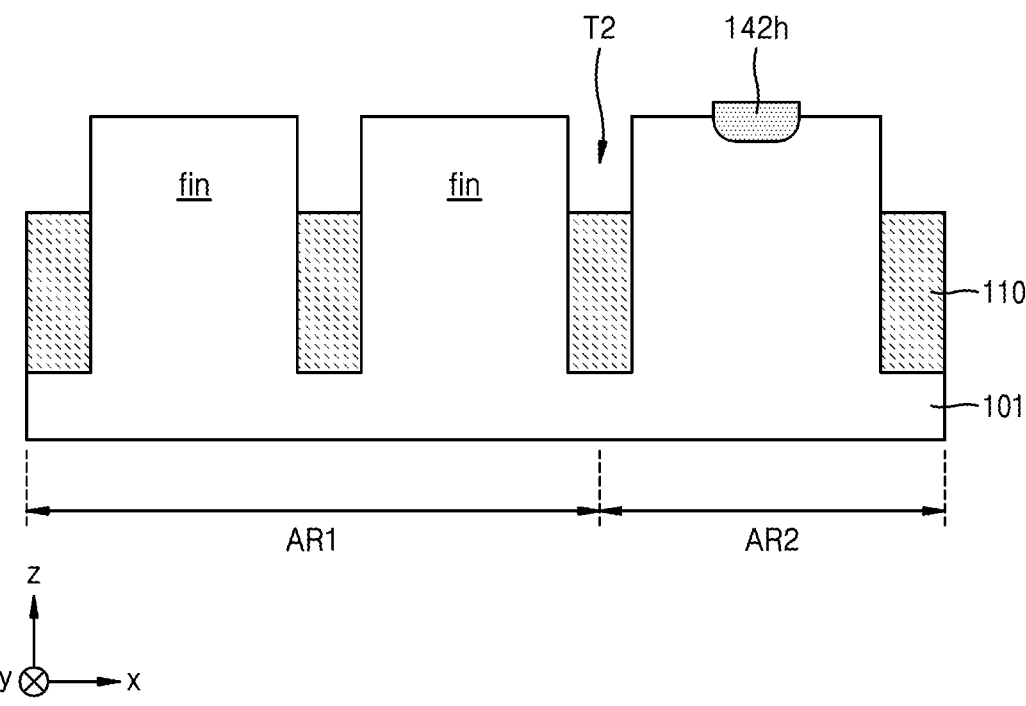
Figure 2H:
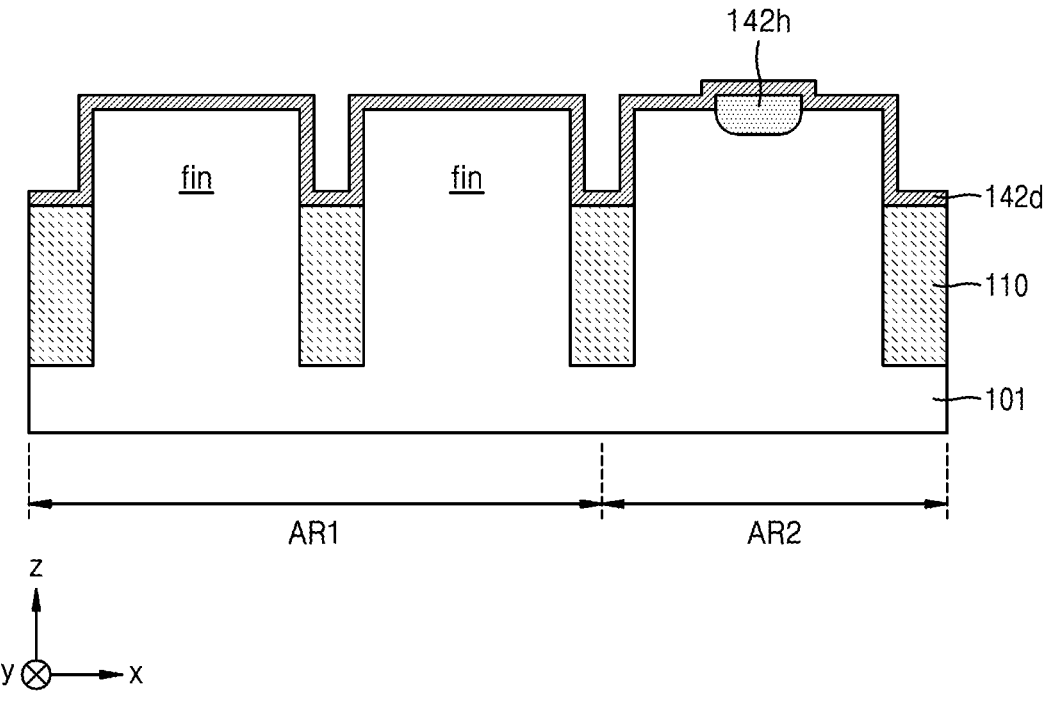
Figure 2I:
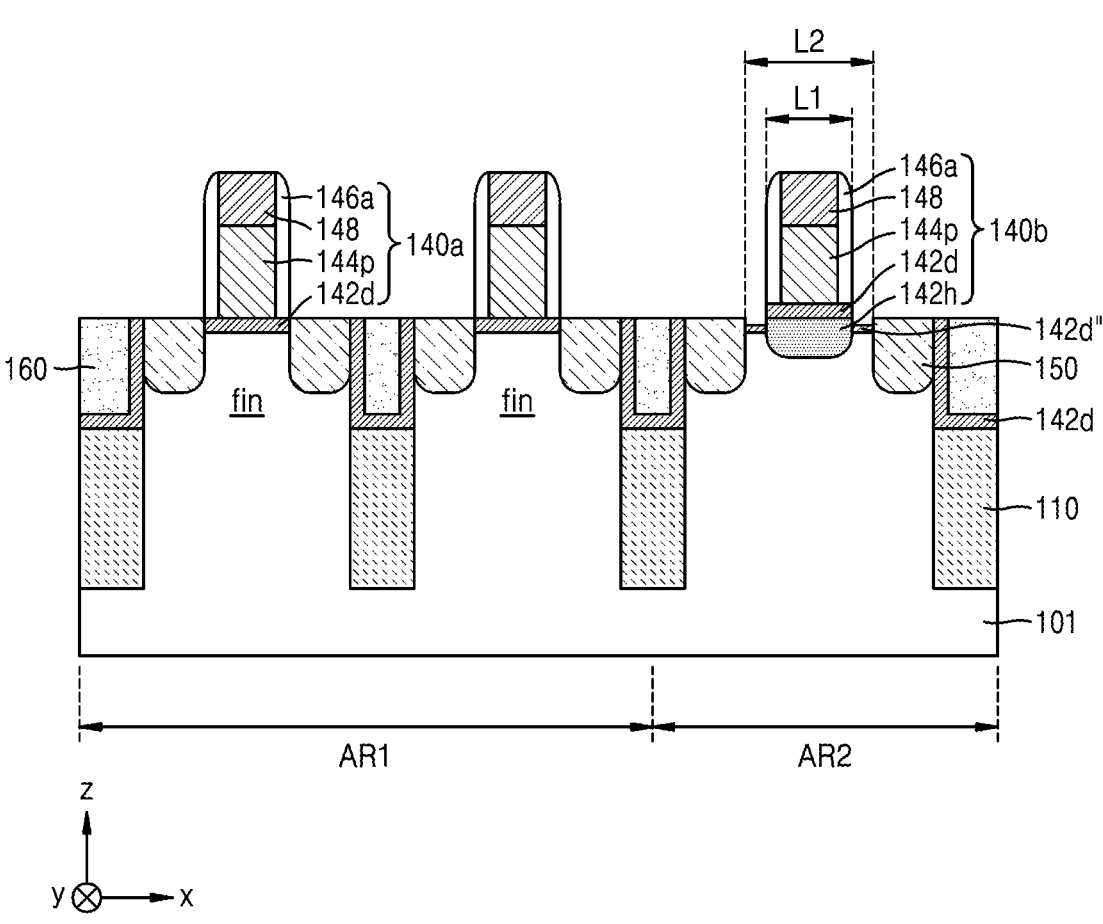
Figure 2J:
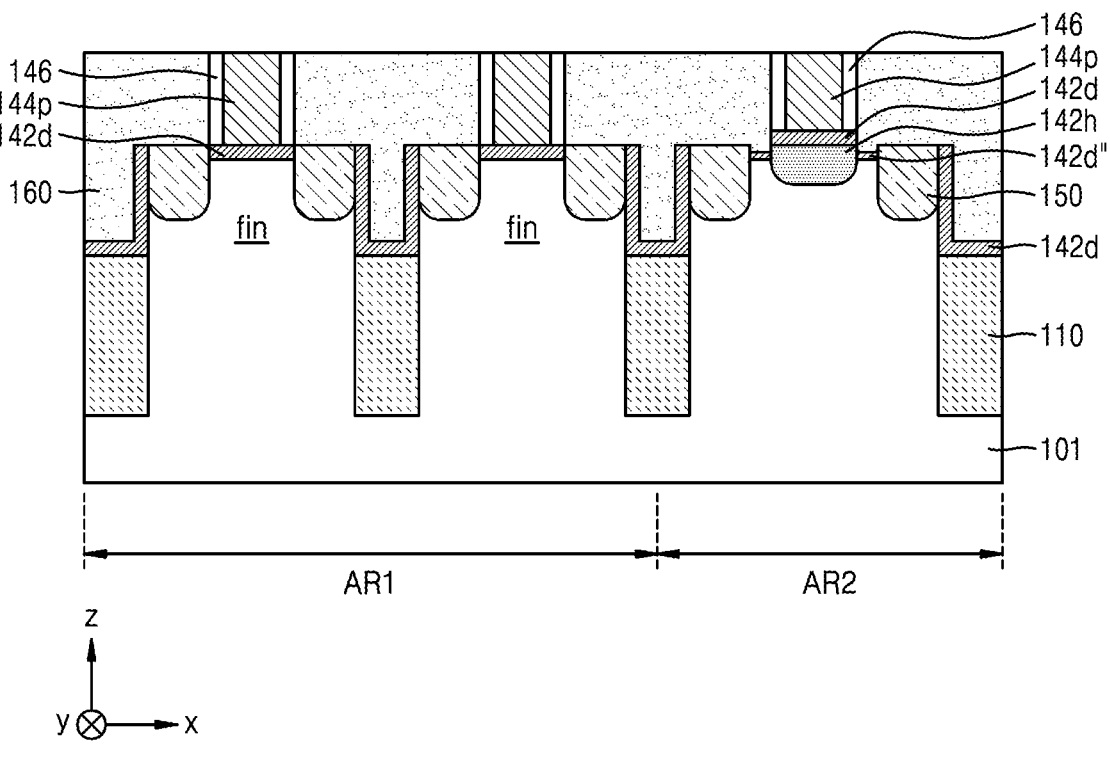
Figure 2K:
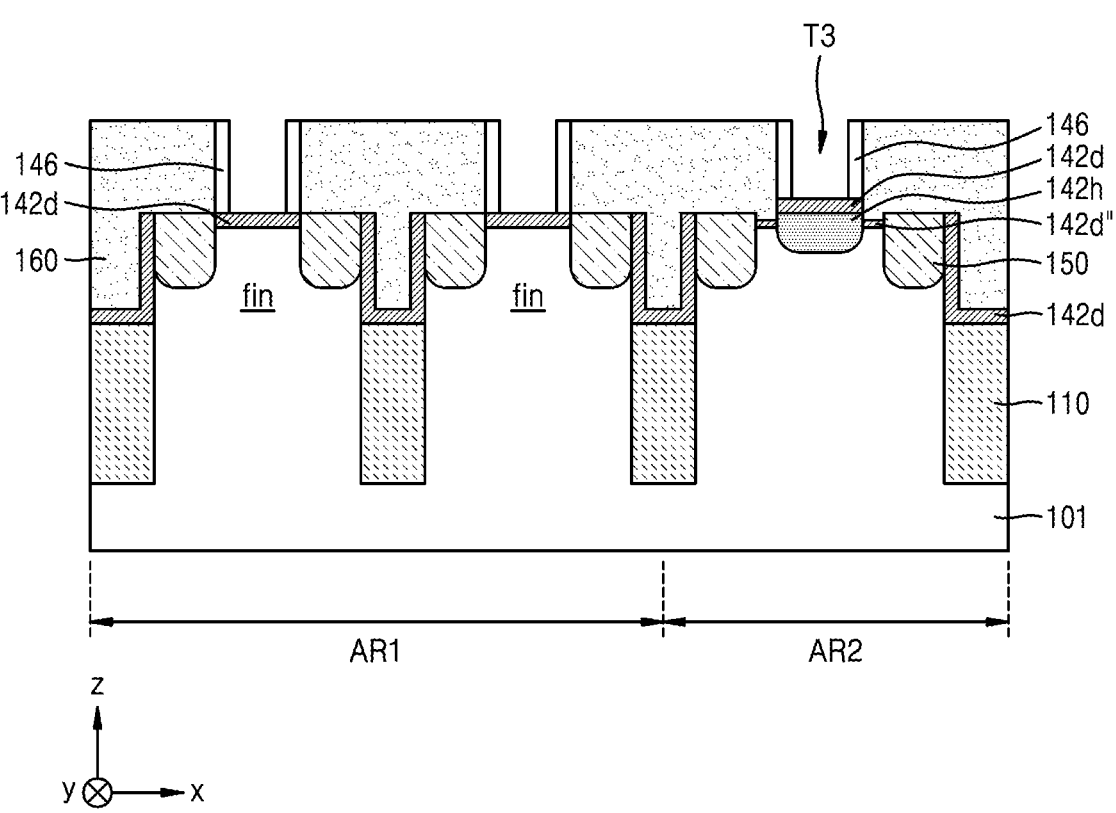
Figure 2L:
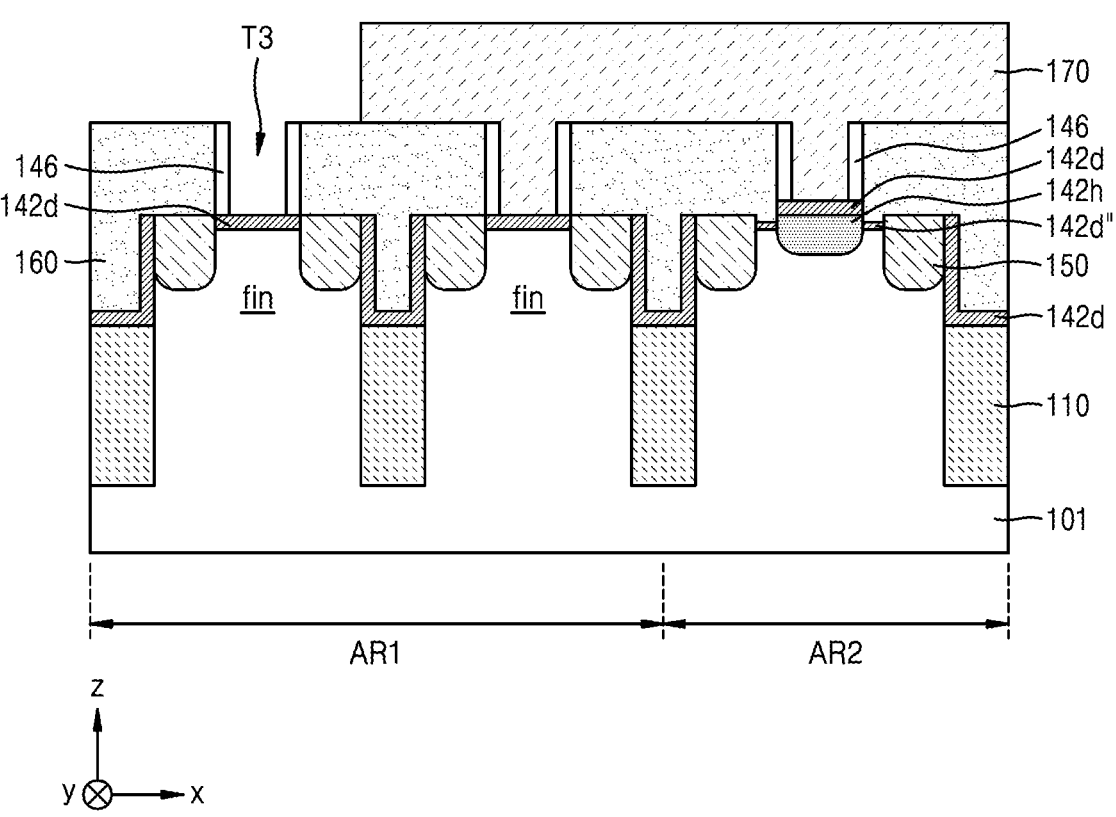
Figure 2M:
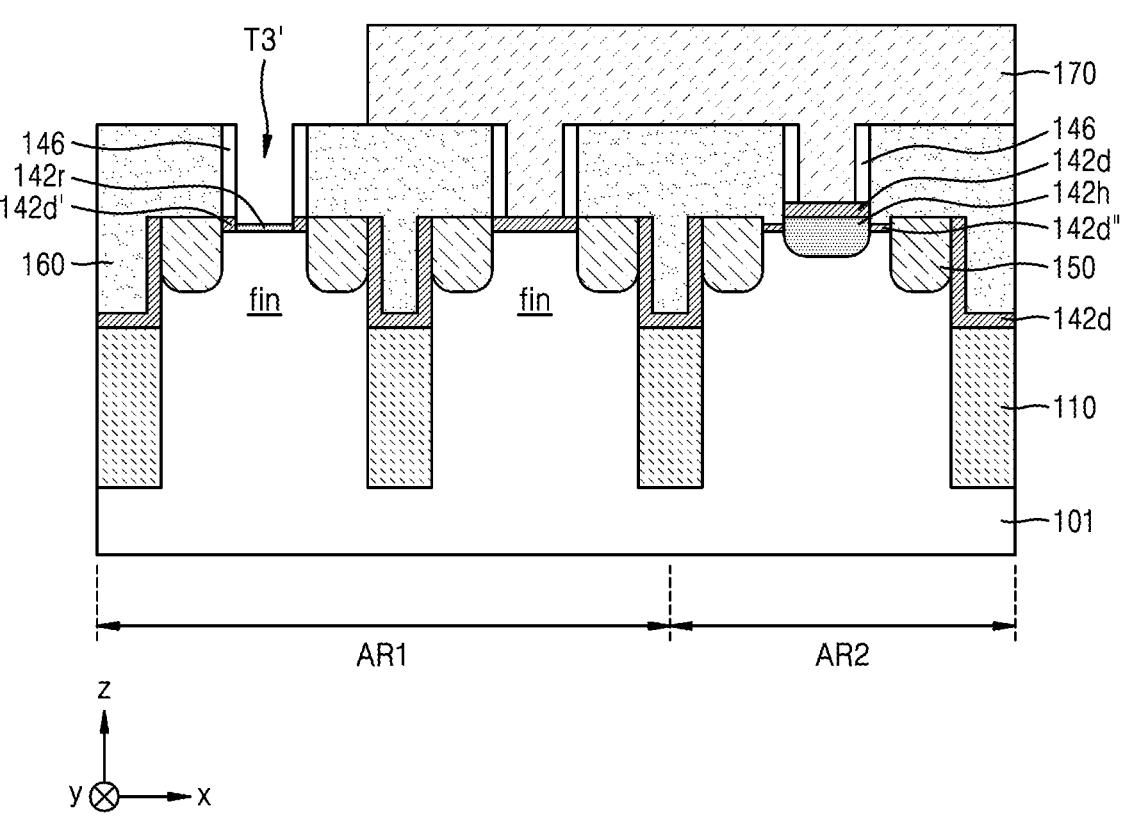
Figure 2N:
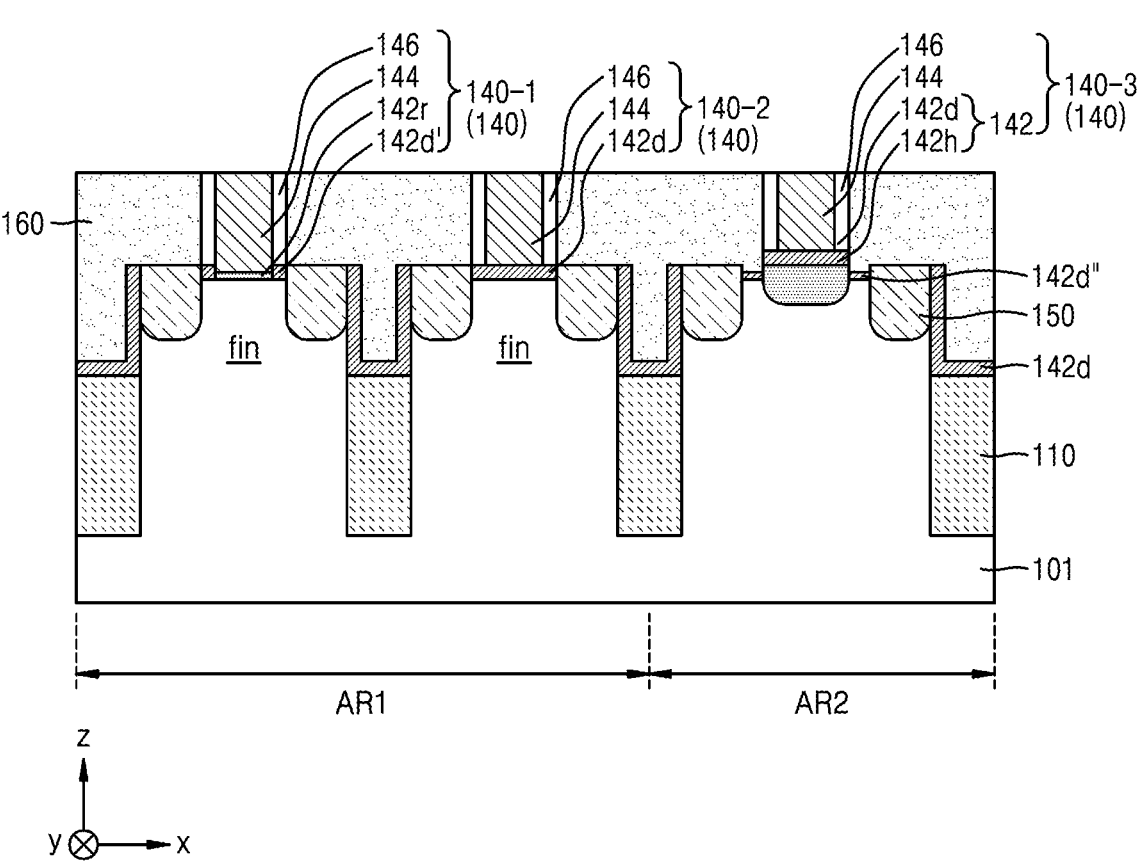

FIGS. 2A to 2N are cross-sectional views illustrating stages in a process of manufacturing the semiconductor device 100 of FIG. 1. FIGS. 2A to 2N will be described together with reference to FIG. 1, and descriptions already given with reference to FIG. 1 will be only briefly provided or omitted.

Referring to FIG. 2A, in the process of manufacturing the semiconductor device 100 according to the present embodiment, first, a plurality of fins may be formed in the first area AR1 of the substrate 101. The fins may extend in the first direction (e.g., in the x-direction) and may be spaced apart from each other in the second direction (e.g., in the y-direction). A well may be formed in the upper portion of the substrate 101 in the second area AR2 of the substrate 101.

Thereafter, a preliminary device isolation layer 110a that separates the fins from each other in the first direction, and further separates the first area AR1 and the second area AR2 from each other, may be formed. The preliminary device isolation layer 110a may be formed by forming a trench in the substrate 101 and filling the trench with an insulating layer, e.g., an oxide layer. For example, portions of the insulating layer on the top surface of the substrate 101 may be removed through a planarization process, e.g., chemical mechanical polishing (CMP).

Referring to FIG. 2B, after the preliminary device isolation layer 110a is formed, a hard mask layer 120 is formed on the substrate 101 and the preliminary device isolation layer 110a. The hard mask layer 120 may be formed of, e.g., silicon nitride (SiN). In addition, the hard mask layer 120 may be formed to a thickness of, e.g., about 760 angstroms.

Referring to FIG. 2C, after the hard mask layer 120 is formed, a first photoresist (PR) pattern 130 is formed on the hard mask layer 120 through a photolithography process. After the first PR pattern 130 is formed, the hard mask layer 120 is etched using the first PR pattern 130. Subsequently, the upper portion of the substrate 101 in the second area AR2 is etched using the first PR pattern 130 and the hard mask layer 120 to form a first trench T1. A recess R may be formed in the upper portion of the substrate 101 through the formation of the first trench T1. The recess R may have a depth, e.g., of about 80 angstroms to 100 angstroms, from the upper surface of the substrate 101.

Referring to FIG. 2D, after the first trench T1 is formed, the first PR pattern 130 is removed, and a first preliminary oxide layer 142a filling the first trench T1 may be formed. The first preliminary oxide layer 142a may be formed through an HDP CVD process. The first preliminary oxide layer 142a may be formed to a thickness sufficient to, e.g., completely, fill the first trench T1, e.g., about 2000 angstroms.

Referring to FIG. 2E, thereafter, a portion of the first preliminary oxide layer 142a on an upper surface of the hard mask layer 120 is removed through the CMP process, such that only a portion of the first preliminary oxide layer 142a inside the first trench T1 remains. That is, a second preliminary oxide layer 142b remains only in the first trench T1.

The CMP process may be performed using the hard mask layer 120 as an etch stop layer. Accordingly, the portion of the first preliminary oxide layer 142a on the upper surface of the hard mask layer 120 may be entirely removed through the CMP process, and the upper surface of the hard mask layer 120 may be exposed, e.g., the upper surface of the hard mask layer 120 may be coplanar with an upper surface of the second preliminary oxide layer 142b in the first trench T1.

Referring to FIG. 2F, after the CMP process, the hard mask layer 120 may be removed, such that the second preliminary oxide layer 142b may fill a bottom of the first trench T1 and protrude above the upper surface of the substrate 101.

For example, the hard mask layer 120 may be removed through a strip process. In another example, when the hard mask layer 120 is formed of a nitride layer, the hard mask layer 120 may be removed through wet etching using an etchant having an etch selectivity with respect to the substrate 101, the preliminary device isolation layer 110a, and the second preliminary oxide layer 142b.

Referring to FIG. 2G, an upper portion of the preliminary device isolation layer 110a and an upper portion of the second preliminary oxide layer 142b may be removed through an etching process. For example, the etching process may be performed by wet etching using an etchant having an etching selectivity with respect to the substrate 101. Although both the preliminary device isolation layer 110a and the second preliminary oxide layer 142b are oxide layers, there is a difference in material properties according to a formation method. Accordingly, in wet etching, the preliminary device isolation layer 110a and the second preliminary oxide layer 142b may have different etch rates. For example, in wet etching, the second preliminary oxide layer 142b may be etched faster than the preliminary device isolation layer 110a, e.g., a removed portion of the second preliminary oxide layer 142b may be thicker than a removed portion of the preliminary device isolation layer 110a. For example, a removed portion of the preliminary device isolation layer 110a may have a thickness equal to or less than about 470 angstroms, and a removed portion of the second preliminary oxide layer 142b may have a thickness equal to or less than about 760 angstroms.

After the etching process, a second trench T2 may be formed in the upper portion of the preliminary device isolation layer 110, e.g., as a result of etching the preliminary device isolation layer 110a, such that the device isolation layer 110 is formed. Also, after the etching process, the first oxide layer 142h may be formed on the substrate 101 in a recessed structure, e.g., as a result of etching the second preliminary oxide layer 142b. For example, as illustrated in FIG. 2G, the upper surface of the first oxide layer 142h may be higher than the upper surface of the substrate 101, e.g., relative to the bottom of the substrate 101. In another example, the upper surface of the first oxide layer 142h may be at substantially the same height as the upper surface of the substrate 101.

Referring to FIG. 2H, after the second trench T2 and the first oxide layer 142h are formed, the second oxide layer 142d is formed to cover the substrate 101, the second trench T2, and the first oxide layer 142h with a uniform thickness. The second oxide layer 142d may be formed, e.g., conformally, through the DPN process. For reference, the first oxide layer 142h is formed through the HDP process, and thus, may be referred to as an HDP oxide layer, and the second oxide layer 142d is formed through the DPN process, and thus, may be referred to as a DPN oxide layer. For reference, the DPN process is a process of implanting nitrogen into the oxide layer, such that a gate leakage current may be improved according to the concentration of the implanted nitrogen, and penetration of impurities, e.g., boron and phosphorus, may be improved.

The second oxide layer 142d may be formed to a thickness of about 35 angstroms to about 70 angstroms. As shown in FIG. 2H, the second oxide layer 142d may cover the upper surface of the substrate 101, the bottom and side surfaces of the second trench T2, and the first oxide layer 142h exposed on the substrate 101 with a uniform thickness.

Referring to FIG. 2I, after the second oxide layer 142d is formed, preliminary gate structures 140a and 140 and the source/drain regions 150 may be formed on the substrate 101. The preliminary gate structures 140a and 140b may include the first preliminary gate structure 140a in the first area AR1 and the second preliminary gate structure 140b in the second area AR2. The first preliminary gate structure 140a may include the second oxide layer 142d, a polygate 144p, a spacer 146a, and a capping layer 148. Also, the second preliminary gate structure 140b may include the first oxide layer 142h, the second oxide layer 142d, the polygate 144p, the spacer 146a, and the capping layer 148.

A process of forming the preliminary gate structures 140a and 140b will be briefly described as follows. First, a polysilicon layer and a capping insulating layer may be formed on the second oxide layer 142d, and the polygate 144p and the capping layer 148 may be formed through a patterning process. Thereafter, a spacer material layer may be formed over the entire structure on the substrate 101. For example, the spacer material layer may be formed of a nitride layer, e.g., SiN. Thereafter, the spacer material layer on the upper surface of the capping layer 148 and the second oxide layer 142d may be removed through etch-back, and the spacers 146a may be formed on both side surfaces of the polygate 144p and the capping layer 148 in the first direction (e.g., in the x-direction).

As described above, in the case of the first area AR1, the source/drain region 150 may be formed by doping the fins on both sides of the first preliminary gate structure 140a at high concentration in the first direction (e.g., in the x-direction), or may be formed through epi growth after removing upper portions of the fins. In the case of the second area AR2, the source/drain region 150 may be formed by doping the upper portion of the substrate 101 on both sides of the second preliminary gate structure 140b at high concentration in the first direction (e.g., in the x-direction), or may be formed through epi growth after removing the upper portion of the substrate 101. In the process of manufacturing the semiconductor device 100 of the present embodiment, the source/drain regions 150 may be formed through epi growth.

Referring to FIG. 2I, a second partial oxide layer 142d" may be disposed between the second preliminary gate structure 140b and the source/drain regions 150. The second partial oxide layer 142d" may be naturally generated in the process of forming the second preliminary gate structure 140b based on the structure of the first oxide layer 142h. The process of forming the second partial oxide layer 142d" will be described in more detail below with reference to FIGS. 3A to 3C.

Due to the presence of the second partial oxide layer 142d", a second length L2 (i.e., a distance in the x-direction between facing sidewalls of the source/drain regions 150 on opposite sides of the second preliminary gate structure 140b) may be longer than a first length L1 of the second preliminary gate structure 140b (i.e., a length between opposite sidewalls of the second preliminary gate structure 140b in the x-direction). As such, because the length of the channel region between the source/drain regions 150 on both sides of the second preliminary gate structure 140b (i.e., the second length L2) is longer than the length of the second preliminary gate structure 140b (i.e., the first length L1), it may be easier to implementing a high voltage device having a high operating voltage by using the planar FET pFET in the second area AR2.

Referring to FIG. 2J, after the preliminary gate structures 140a and 140b and the source/drain regions 150 are formed, an interlayer insulating layer covering the entire structure on the substrate 101 may be formed. After the formation of the interlayer insulating layer, an upper portion of the interlayer insulating layer, the capping layer 148, and an upper portion of the spacer 146a may be removed through the CMP process. For example, the CMP process may be performed using the polygate 144p as an etch stop layer. Through the CMP process, the interlayer insulating layer 160 may be formed between the preliminary gate structures 140a and 140b, and the spacers 146 may be formed on both side surfaces of the polygate 144p in the first direction (e.g., in the x-direction).

Referring to FIG. 2K, thereafter, the polygate 144p may be removed. The polygate 144p may be removed through wet etching, e.g., using an etchant having an etch selectivity with respect to the interlayer insulating layer 160 and the spacer 146. Through the removal of the polygate 144p, a third trench T3 may be formed on the second oxide layer 142d.

Referring to FIG. 2L, after the third trench T3 is formed, a second PR pattern 170 covering a part of the first area AR1 and the entire structure on the substrate 101 of the second area AR2 may be formed. As illustrated in FIG. 2L, the second PR pattern 170 may be opened without covering the third trench T3 on the left side of the first area AR1.

Referring to FIG. 2M, the second oxide layer 142*d* exposed through the opened third trench T3 may be removed. Through the removal of the second oxide layer 142*d*, the upper surface of the fin may be exposed on a bottom surface of the opened third trench T3'. After the second oxide layer 142*d* is removed, the first partial oxide layer 142*d'* may remain in a lower portion of the spacer 146. The first partial oxide layer 142*d'* is a part remaining after the second oxide layer 142*d* is removed, and thus, may have substantially the same material as that of the second oxide layer 142*d*.

Subsequently, the first gate insulating layer 142*r* may be formed on the bottom surface of the opened third trench T3'. The first gate insulating layer 142*r* may include, e.g., an interface layer and a high-k dielectric layer. The interface layer and the high-k dielectric layer are the same as those described with reference to FIG. 1.

Referring to FIG. 2N, after the first gate insulating layer 142*r* is formed, the second PR pattern 170 may be removed, and the metal gate 144 filling the third trenches T3' and T3 may be formed. The material of the metal gate 144 is the same as described with reference to FIG. 1.

Through the formation of the metal gate 144, the first finFET fFET1 and the second finFET fFET2 may be formed in the first area AR1, and the planar FET pFET may be formed in the second area AR2. The first finFET fFET1 may include the first gate insulating layer 142*r*, the second finFET fFET2 may include the second gate insulating layer 142*d*, and the planar FET pFET may include the third gate insulating layer 142. The thicknesses may increase in the order of the first gate insulating layer 142*r*, the second gate insulating layer 142*d*, and the third gate insulating layer 142. Accordingly, the operating voltages may be increase, e.g., may be high, in the order of the first finFET fFET1, the second finFET fFET2, and the planar FET pFET.

In addition, in the case of the planar FET pFET, the second partial oxide layers 142*d''* may be present on both side surfaces of the third gate structure 140-3, and thus may have a higher voltage operation characteristic. For example, the first finFET fFET1 may have an operating voltage of about 0.8 V, the second finFET fFET2 may have an operating voltage equal to or less than 2.2 V, and the planar FET pFET may have an operating voltage equal to or greater than 3.3V.

As described above, in the manufacturing process of the semiconductor device 100 of the present embodiment, the planar FET pFET may be formed together, e.g., simultaneously, with other finFETs, e.g., first and second finFETs fFET1 and fFET2, through a, e.g., same, finFET process. Accordingly, in the semiconductor device 100 of the present embodiment, a planar FET pFET having high voltage operation characteristics may be easily formed through the finFET process, and the reliability of the planar FET pFET may be greatly improved.

Figure 3A:
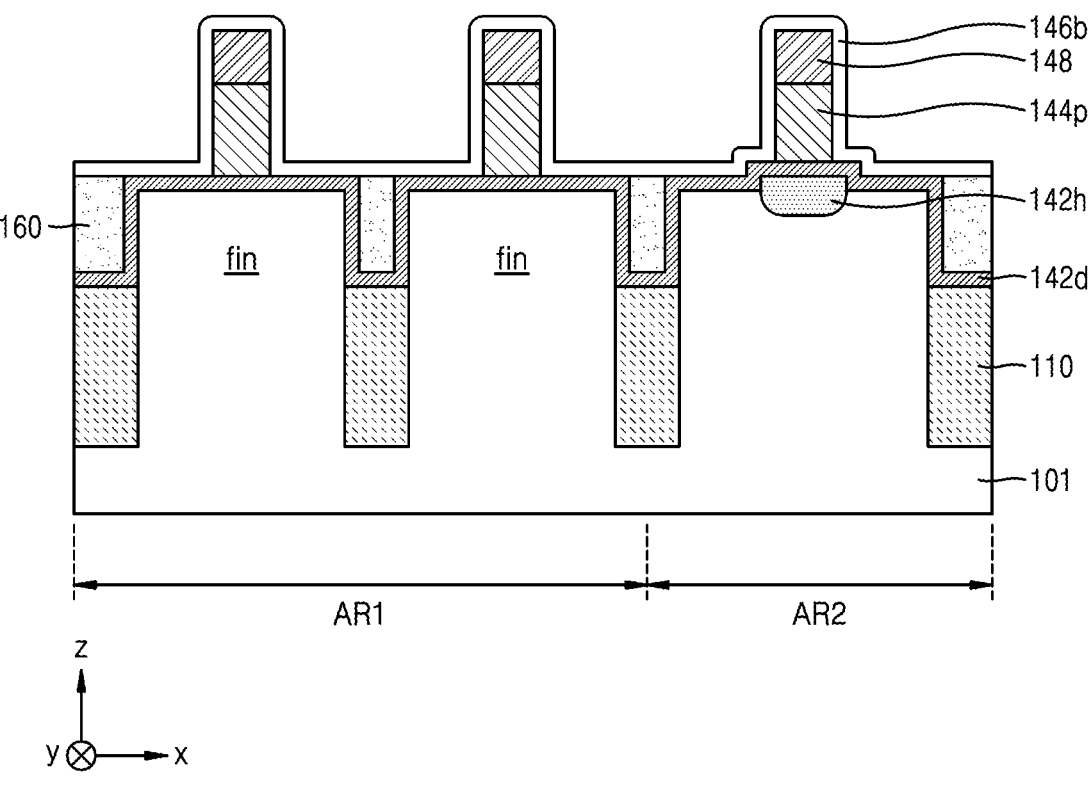
FIGS. 3A to 3C are cross-sectional views illustrating in more detail a process of manufacturing the semiconductor device with reference to FIG. 2I.
Figure 3B:
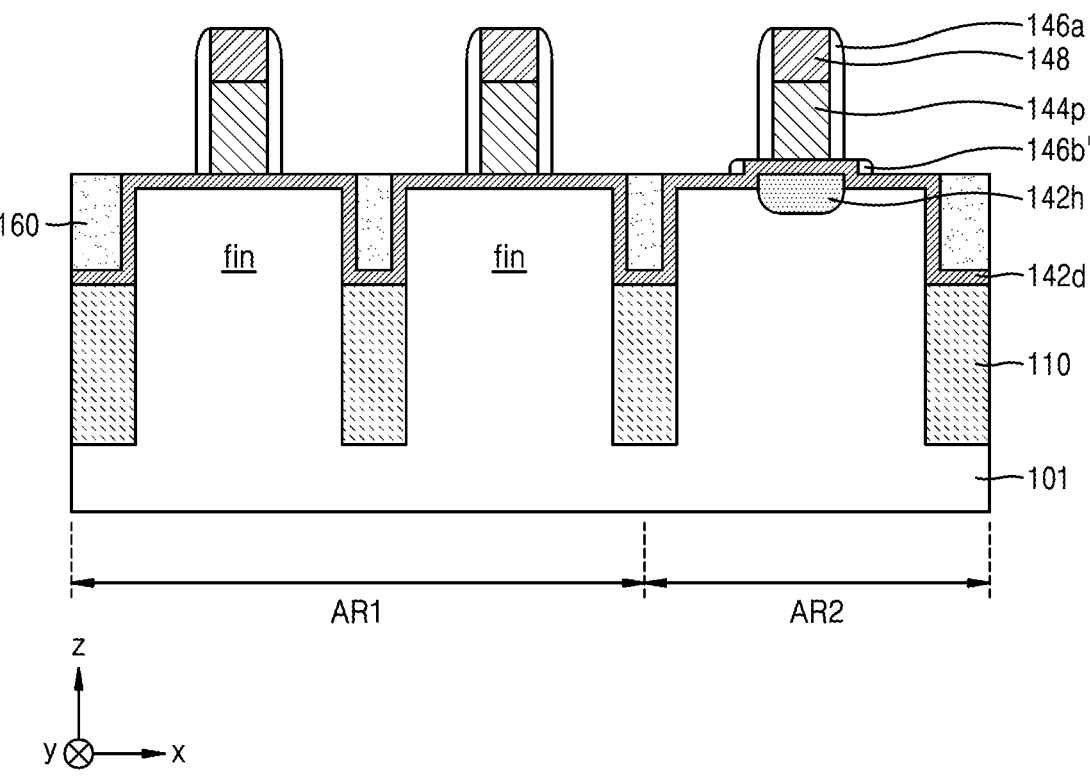
Figure 3C:
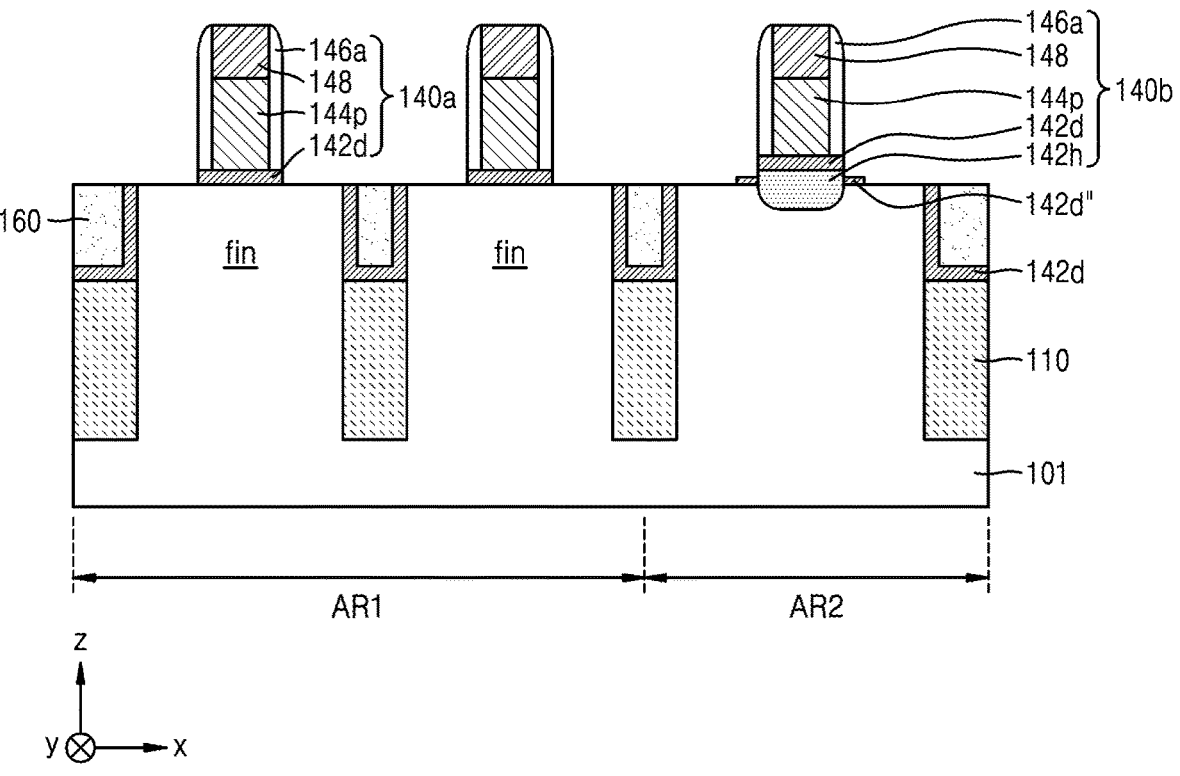

FIGS. 3A to 3C are cross-sectional views illustrating in more detail a process of manufacturing the semiconductor device with reference to FIG. 2I.

Referring to FIG. 3A, after the second oxide layer 142*d* is formed, a remaining space of the second trench T2 may be filled with an interlayer insulating layer. For example, the remaining space of the second trench T2 may be filled with a spacer material layer 146*b* to be described below.

Thereafter, the polygate 144*p* and the capping layer 148 may be formed on the second oxide layer 142*d*. As described above, the polygate 144*p* and the capping layer 148 may be formed by forming a polysilicon layer and a capping insulating layer on the second oxide layer 142*d* and patterning the polysilicon layer and the capping insulating layer.

Subsequently, the spacer material layer 146*b* covering the entire structure on the substrate 101 with a uniform thickness may be formed. For example, the spacer material layer 146*b* may include a nitride layer, e.g., SiN.

Referring to FIG. 3B, after the spacer material layer 146*b* is formed, the spacers 146*a* are formed on both side surfaces of the polygate 144*p* and the capping layer 148 in the first direction (e.g., in the x-direction) by removing the spacer material layer 146*b* on an upper surface of the capping layer 148 and an upper surface of the second oxide layer 142*d* through an etch-back process. The second oxide layers 142*d* of the second area AR2 may have a stepped portion on both side surfaces of the first oxide layer 142*h* based on the structure of the first oxide layer 142*h*, e.g., since the first oxide layer 142*h* protrudes above the upper surface of the substrate 101. Accordingly, as shown in FIG. 3B, during the etch-back process, a partial spacer material layer 146*b'* may remain in the stepped portion of the second oxide layer 142*d* of the second area AR2.

Referring to FIG. 3C, subsequently, the second oxide layer 142*d* may be removed using the capping layer 148 and the spacers 146*a* as an etch mask. Through the removal of the second oxide layer 142*d*, upper surfaces of fins may be exposed in the first area AR1, and an upper surface of the substrate 101 may be exposed in the second area AR2. Meanwhile, because the partial spacer material layer 146*b'* has the same material as that of the spacer 146*a*, etching may not be performed well. Also, the second oxide layer 142*d* of the second area AR2 may be thicker than other portions in the stepped portion. Accordingly, in the process of removing the second oxide layer 142*d*, a part of the partial spacer material layer 146*b'* and the second partial oxide layer 142*d''* therebelow may remain, or the second partial oxide layer 142*d''* may remain. FIGS. 2I and 3C show that only the second partial oxide layer 142*d''* remains.

Through the removal of the second oxide layer 142*d*, the first preliminary gate structure 140*a* may be formed in the first area AR1 and the second preliminary gate structure 140*b* may be formed in the second area AR2. Thereafter, in the first area AR1, the source/drain regions 150 may be formed in the fins on side surfaces of the first preliminary gate structure 140*a* in the first direction (e.g., in the x-direction), and the source/drain regions 150 may be formed in upper portions of the substrate 101 on both side surfaces of the second preliminary gate structure 140*b* in the first direction (e.g., in the x-direction).

Figure 5:
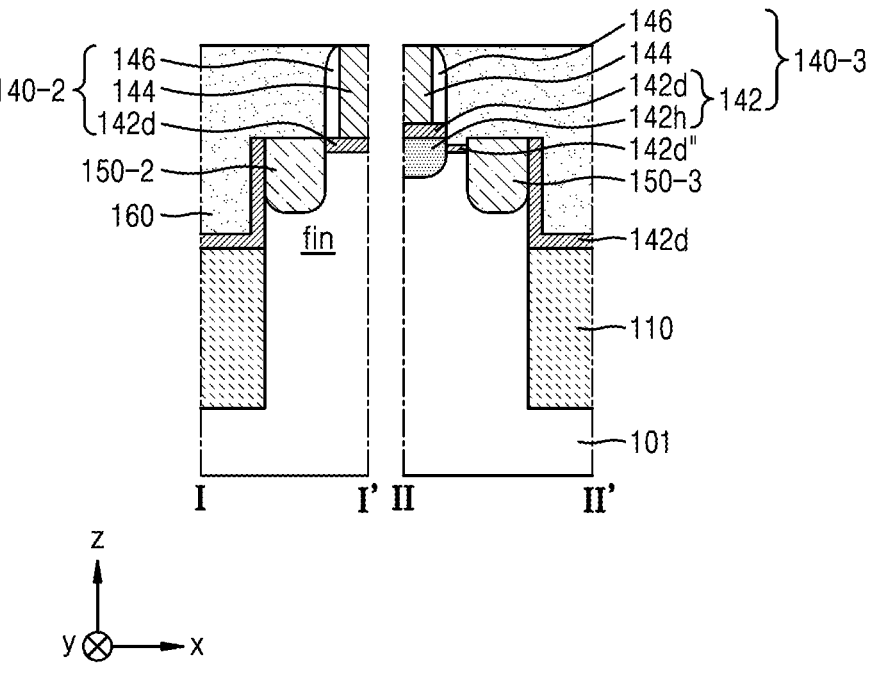
FIG. 5 is a cross-sectional view along lines I-I' and II-II' of FIG. 4.

FIG. 4 is a plan view of the semiconductor device of FIG. 1, and FIG. 5 is a cross-sectional view along lines I-I' and II-II' of FIG. 4. FIGS. 4 and 5 will be described with reference to FIG. 1, and descriptions already given with reference to FIGS. 1 to 3C will be only briefly provided or omitted.

Referring to FIGS. 4 and 5, a plurality of fins may be disposed in the first area AR1. The fins may extend in the first direction (e.g., in the x-direction) and may be spaced apart from each other in the second direction (e.g., in the y-direction). The device isolation layer 110 may be disposed between the fins and between the first area AR1 and the second area AR2 in the first direction (e.g., in the x direction). Also, in the first area AR1, the inter-fin insulating layer 115 may be disposed between the fins in the second direction (e.g., in the y-direction).

Referring to FIG. 4, in the first area AR1, the first source/drain region 150-1 and the second source/drain region 150-2 respectively on both side surfaces of the first gate structure 140-1 and the second gate structure 140-2 in the first direction (e.g., in the x-direction) may be formed through epi growth after the removal of upper portions of the fins. Also, in the second area AR2, the third source/drain regions 150-3 on both side surfaces of the third gate structure 140-3 in the first direction (e.g., in the x-direction) may be formed through epi growth after the removal of the upper regions of the substrate 101.

As may be seen from FIG. 5, the second gate insulating layer 142*d* of the second gate structure 140-2 may be thinner than the third gate insulating layer 142 of the third gate structure 140-3, e.g., in the z-direction. For example, the third gate insulating layer 142 may include the first oxide layer 142*h* and the second oxide layer 142*d* having a recessed structure, and the second oxide layer 142*d* may be substantially the same as the second gate insulating layer 142*d*. Accordingly, the third gate insulating layer 142 may be thicker than the second gate insulating layer 142*d* by the first oxide layer 142*h*. In addition, the second partial oxide layers 142*d''* may be disposed on side surfaces of the first oxide layer 142*h* on both side surfaces of the third gate structure 140-3. In this way, by disposing the second partial oxide layer 142*d''*, the planar FET pFET may have a higher operating voltage characteristic.

By way of summation and review, embodiments provide a semiconductor device including a planar field effect transistor (FET) compatible with finFET processing and having a high operating voltage.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a substrate including a first area and a second area, the first area having a fin extending in a first direction, and the second area having no fin;
a first fin field effect transistor (finFET) and a second finFET on the first area of the substrate, each finFET of the first finFET and second finFET including a first gate structure extending in a second direction perpendicular to the first direction, and first source/drain regions on opposite sides of the first gate structure; and
a planar field effect transistor (FET) on the second area of the substrate, the planar FET including a second gate structure extending in the second direction and second source/drain regions on opposite sides of the second gate structure,
wherein the first gate structure includes a first gate insulating layer on an upper surface of the fin, a first metal gate on the first gate insulating layer, and first spacers on opposite sidewalls of the first metal gate,
wherein the second gate structure includes a second gate insulating layer on the substrate, a second metal gate on the second gate insulating layer, and second spacers on opposite sidewalls of the second metal gate,
wherein the first gate structure overlaps the second gate structure along the first direction,
wherein the upper surface of the fin in the first area and an upper surface of the substrate in the second area have substantially the same height,
wherein the second gate insulating layer includes a first oxide layer in a recess extending from the upper surface of the substrate and a second oxide layer on the first oxide layer,
wherein the first gate insulating layer of the first finFET includes a third oxide layer,
wherein the first gate insulating layer of the second finFET includes the second oxide layer, a thickness of the second oxide layer being thicker than a thickness of the third oxide layer,
wherein an upper surface of the first oxide layer is higher than the upper surface of the substrate,
wherein a first partial oxide layer is between the first oxide layer and the second source/drain regions in the first direction, and
wherein a portion of the second oxide layer forms the first partial oxide layer, which is formed at the same vertical level as part of the first oxide layer.

2. The semiconductor device as claimed in claim 1, wherein the first partial oxide layer is a part remaining after etching of the second oxide layer.

3. The semiconductor device as claimed in claim 1, wherein:
a second partial oxide layer is on lower portions of the first spacers on opposite side surfaces of the third oxide layer in the first direction, and
the first partial oxide layer is a part remaining after etching of the second oxide layer.

4. The semiconductor device as claimed in claim 1, wherein the first oxide layer is a high density plasma (HDP) layer, an upper surface of the first oxide layer being higher than or at a substantially same height as the upper surface of the substrate.

5. The semiconductor device as claimed in claim 1, wherein the second oxide layer is a decoupled plasma nitridation (DPN) layer, the thickness of the second oxide layer being 35 angstroms to 70 angstroms.

6. The semiconductor device as claimed in claim 1, wherein a thickness of the second gate insulating layer is thicker than a thickness of the first gate insulating layer by at least a thickness of the first oxide layer.

7. The semiconductor device as claimed in claim 1, wherein a thickness of the second gate insulating layer is equal to or greater than 70 angstroms.

8. The semiconductor device as claimed in claim 1, wherein:
an operating voltage of the first finFET is 0.8 V, an operating voltage of the second finFET is equal to or less than 2.2 V, and an operating voltage of the planar FET is equal to or greater than 3.3 V.

9. The semiconductor device as claimed in claim 1, wherein the first gate insulating layer of the finFET overlaps the first oxide layer of the planar FET along the first direction.

10. The semiconductor device as claimed in claim 9, wherein:
the first gate insulating layer of the finFET comprises a metal oxide, a metal oxide silicate, or an aluminate; and the second oxide layer of the planar FET covers the first oxide layer of the planar FET and is at a higher vertical height than the first gate insulating layer of the finFET.

11. A semiconductor device, comprising:

a substrate including a first area and a second area, the first area having at least one fin extending in a first direction, and the second area having no fin;

a first fin field effect transistor (finFET) and a second finFET on the first area of the substrate, each of the first finFET and the second finFET including a first gate structure and first source/drain regions on opposite sides of the first gate structure, and the first gate structure including a first gate insulating layer on an upper surface of the at least one fin; and a planar field effect transistor (FET) on the second area of the substrate, the planar FET including a second gate structure on the substrate and second source/drain regions on opposite sides of the second gate structure, and the second gate structure including a second gate insulating layer on the substrate, wherein:

the first gate structure overlaps the second gate structure along the first direction, the upper surface of the at least one fin in the first area and an upper surface of the substrate in the second area have substantially the same height, the second gate insulating layer is in a recess extending from the upper surface of the substrate, the second gate insulating layer includes a first oxide layer in the recess and a second oxide layer on the first oxide layer, the first gate insulating layer of the first finFET includes a third oxide layer, the first gate insulating layer of the second finFET includes the second oxide layer, a thickness of the second oxide layer being thicker than a thickness of the third oxide layer, an upper surface of the first oxide layer is higher than the upper surface of the substrate, a first partial oxide layer, which is a portion of the second oxide layer, is between the first oxide layer and the second source/drain regions, and the portion of the second oxide layer that forms the first partial oxide layer is formed at the same vertical level as part of the first oxide layer.

12. The semiconductor device as claimed in claim 11, wherein:

a thickness of the second gate insulating layer is equal to or greater than 70 angstroms, and an operating voltage of the planar FET is equal to or greater than 3.3V.

13. A semiconductor device, comprising:

a substrate including a first area and a second area, the first area having a fin extending in a first direction, and the second area having no fin;

a first fin field effect transistor (finFET) on the first area of the substrate, the first finFET including a first fin gate structure extending in a second direction perpendicular to the first direction;

a second finFET on the first area of the substrate, the second finFET being separated from the first finFET by a device isolation region and including a second fin gate structure extending in the second direction; and a planar field effect transistor (FET) on the second area of the substrate, the planar FET including a planar gate structure, wherein the first fin gate structure and the second fin gate structure overlap the planar gate structure along the first direction, wherein an upper surface of the fin in the first area and an upper surface of the substrate in the second area have a substantially same height, wherein a gate insulating layer of the first fin gate structure, a gate insulating layer of the second fin gate structure, and a gate insulating layer of the planar gate structure have increasing thicknesses in the stated order, wherein the gate insulating layer of the planar gate structure is in a recess extending from the upper surface of the substrate, and wherein:

the gate insulating layer of the planar gate structure includes a first oxide layer in the recess and a second oxide layer on the first oxide layer, the gate insulating layer of the first finFET includes a third oxide layer, the gate insulating layer of the second finFET includes the second oxide layer, a thickness of the second oxide layer being thicker than a thickness of the third oxide layer, an upper surface of the first oxide layer is higher than the upper surface of the substrate, a first partial oxide layer, which is a portion of the second oxide layer, is on opposite side surfaces of the first oxide layer in the first direction, and the portion of the second oxide layer that forms the first partial oxide layer is formed at the same vertical level as part of the first oxide layer.

14. The semiconductor device as claimed in claim 13, wherein:

a thickness of the gate insulating layer of the planar gate structure is equal to or greater than 70 angstroms, and an operating voltage of the first finFET is 0.8 V, an operating voltage of the second finFET is equal to or less than 2.2 V, and an operating voltage of the planar FET is equal to or greater than 3.3 V.

\* \* \* \* \*